(12) United States Patent
Do et al.

(10) Patent No.: US 6,424,140 B1
(45) Date of Patent: Jul. 23, 2002

(54) CHIP SCALE ELECTRICAL TEST FIXTURE

(75) Inventors: Nhon T. Do, Mountain View; Thomas S. Tarter, Campbell, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/563,489

(22) Filed: May 3, 2000

(51) Int. Cl.[7] .............................................. G01R 31/02
(52) U.S. Cl. ................................... 324/158.1; 324/761
(58) Field of Search ............................. 324/158.1, 761, 324/755, 754, 750, 751, 756, 757, 758

(56) References Cited

U.S. PATENT DOCUMENTS

| | | | |
|---|---|---|---|
| 4,952,871 A | * 8/1990 | Driller et al. ............ 324/158 F |
| 5,854,558 A | * 12/1998 | Motooka et al. ............ 324/754 |
| 5,929,649 A | * 7/1999 | Cramer ........................ 324/761 |
| 5,955,888 A | 9/1999 | Frederickson et al. | |
| 5,986,460 A | 11/1999 | Kawakami | |
| 5,990,696 A | 11/1999 | Swart | |
| 6,040,702 A | * 3/2000 | Hembree et al. ............ 324/755 |

* cited by examiner

*Primary Examiner*—Michael J. Sherry
*Assistant Examiner*—Parresh Patel

(57) ABSTRACT

A test fixture and method of isolating an electrical contact of chip scale package for testing the electrical characteristics of the electrical contact has a base and an isolation plate. The isolation plate is configured to contact and ground all of the electrical contacts of the chip scale package under test, except for a selected subset of the electrical contacts. The isolation plate includes a hole that provides access to the selected subset of electrical contacts to allow a test probe access to the isolated electrical contact.

15 Claims, 3 Drawing Sheets

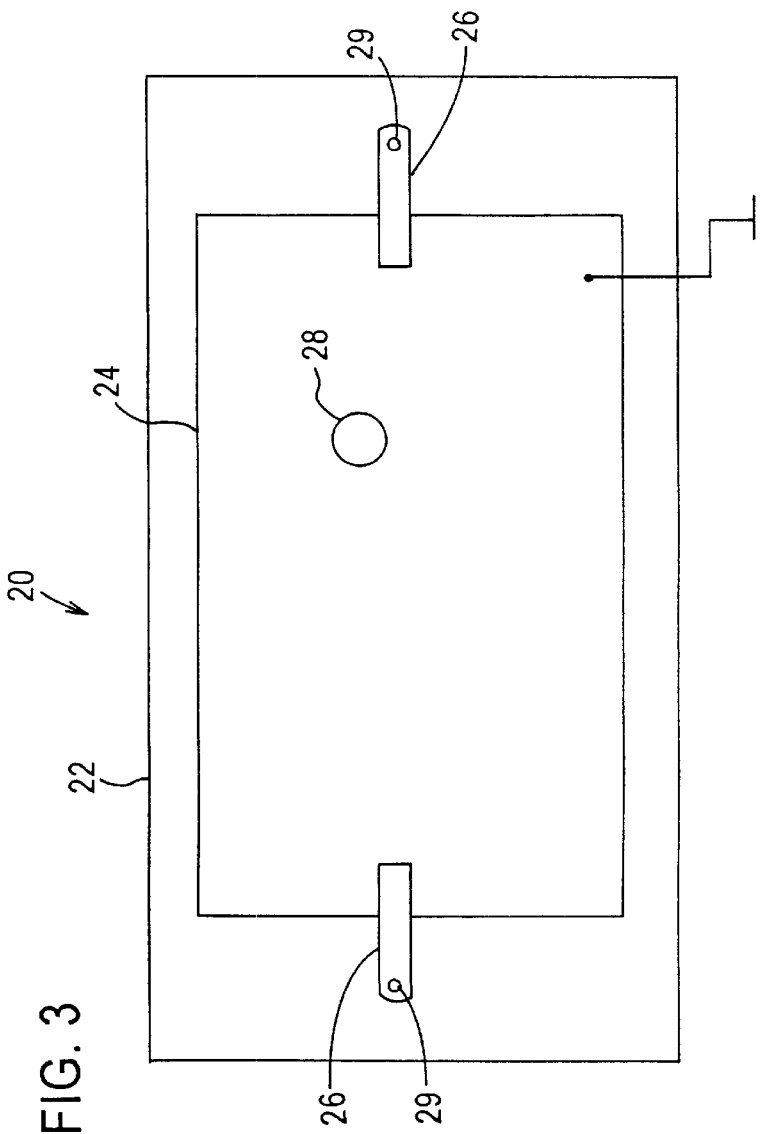
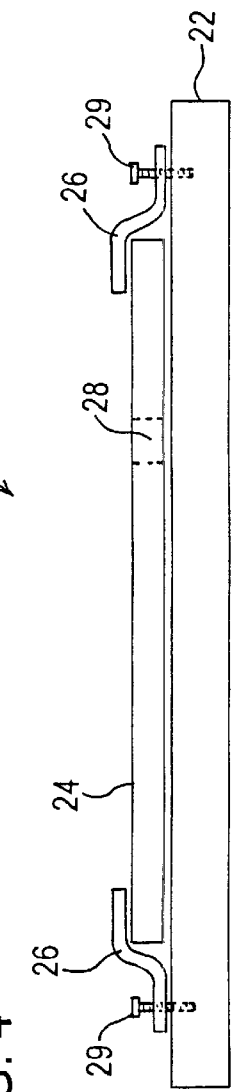
FIG. 3
FIG. 4

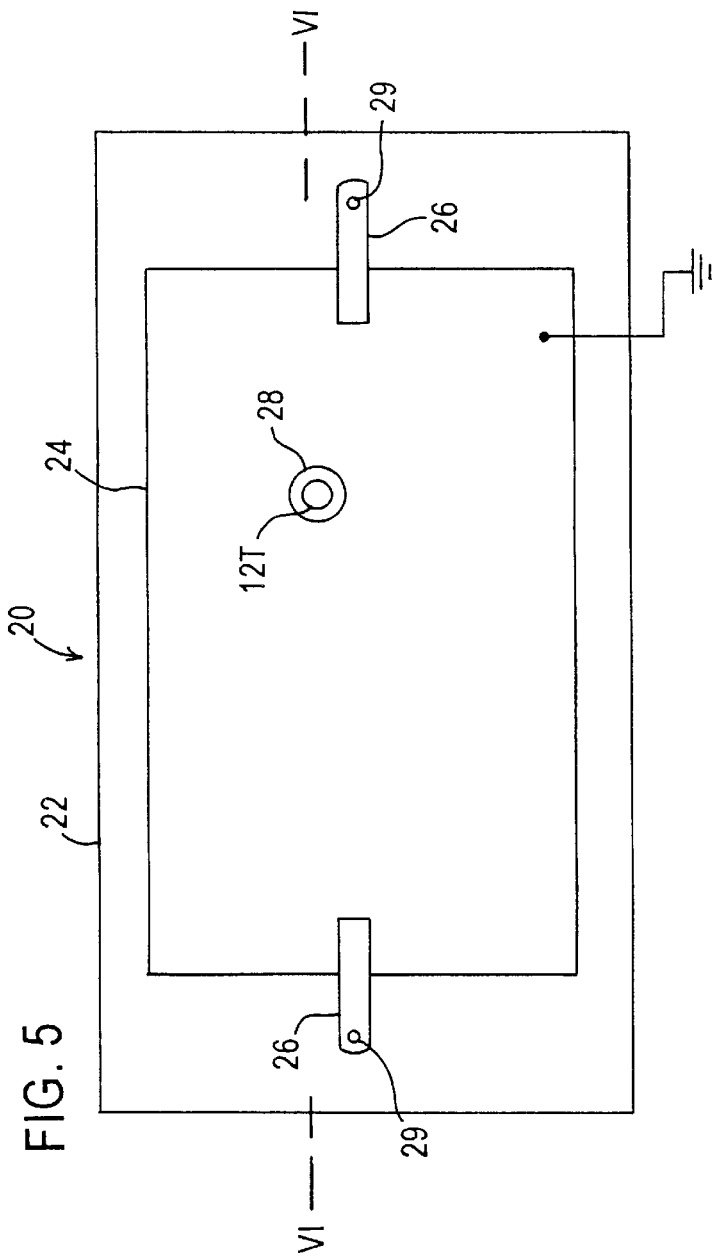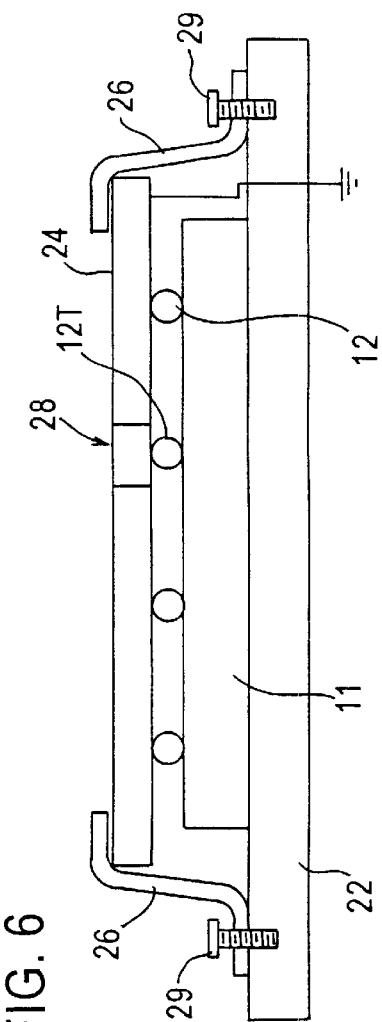

CHIP SCALE ELECTRICAL TEST FIXTURE

FIELD OF THE INVENTION

The present invention relates to the testing of integrated circuits, and in particular, to the electrical characterization of a chip scale package.

DESCRIPTION OF RELATED ART

Electrical components utilizing integrated circuit chips are used in a number of applications. Controlled Collapsed Chip Connection is an interconnect technology developed as an alternative to wire bonding. This technology is generally known as C4 technology, or flip chip packaging. Broadly stated, one or more integrated circuit chips are mounted above a single or multiple layer substrate and pads on the chip are electrically connected to corresponding pads on a substrate by a plurality of electrical connections, such as solder bumps. The integrated circuit chips may be assembled in an array such as a 10×10 array. A substrate is then electrically connected to another electronic device such as a circuit board with the total package being used in an electronic device such as a computer.

It is desirable to perform an electrical characterization of an integrated circuit by measuring inductance (L), capacitance (C), and resistance (R) at electrical contacts of the integrated circuit. This has presented a problem, however, when measuring these parameters for a "chip scale package."Semiconductor dice, or chips, are typically individually packaged for use in plastic or ceramic packages. This is sometimes referred to as the first level of packaging. The package is required to support, protect, and dissipate heat from the die and to provide a lead system for power and signal distribution to the die. The package is also useful for performing burn-in and functionality testing of the die.

One type of semiconductor package is referred to as a "chip scale package." Chip scale packages are also referred to as "chip size packages," and the dice are referred to as being, "minimally packaged." Chip scale packages can be fabricated in "uncased" or "cased" configurations. Uncased chip scale packages have a footprint that is about the same as an unpackaged die. Cased chip scale packages have a peripheral outline that is slightly larger than an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise flexible material, such as a polymer tape, or a rigid material, such as silicon, ceramic, or glass. The external contacts for one type of chip scale package includes solder balls arranged in a dense array, such as a ball grid array "BGA," or a fine ball grid array "FBGA." These dense arrays permit a high input/output capability for the chip scale package. For example, a FBGA on a chip scale package can include several hundred solder balls.

In order to test the electrical characteristics of the integrated circuit, test probes are used to contact individual solder balls. Performing precise measurements of the electrical characteristics on a chip scale package is very difficult, however, due to the dimensions. It is hard to isolate a single solder ball or other electrical contact, while grounding the remainder of the solder balls. Hence, isolation and testing of a single, selected solder ball of an integrated circuit has proven to be a difficult task.

SUMMARY OF THE INVENTION

There is a need for a test fixture that is able to isolate a single electrical contact (e.g., solder ball) on a chip scale package, while grounding all of the remaining solder balls on the chip scale package. Such a test fixture permits proper isolation of the solder ball under test for determining electrical characteristics at the solder ball.

These and other needs are met by embodiments of the present invention which provide a test fixture for holding, for electrical characteristic testing, an integrated circuit chip having a plurality of electrical contacts. This test fixture comprises a base, an isolation plate, and a holding device configured to hold the isolation plate against the base with an integrated circuit under test between the base and the isolation plate. The isolation plate is configured to contact and ground all of the plurality of electrical contacts of the integrated circuits under test, except for a selected subset of the electrical contacts.

By providing an isolation plate, that contacts and grounds all of the plurality of electrical contacts, except for a selected subset of these contacts, a single electrical contact may be isolated for electrical characteristic testing. Hence, electrical characteristics of a chip scale package may be adequately tested.

The earlier stated needs are also met by another embodiment of the present invention which provides a method of isolating an electrical contact of a chip scale package for testing the electrical characteristics at the electrical contact. This method comprises the steps of positioning a chip scale package to expose all of the electrical contacts of the chip scale package, and placing a conductive plate on the chip scale package. This plate is placed so that the plate contacts all of the electrical contacts except for a selected subset of the electrical contacts. The conductive plate is grounded to thereby ground all of the electrical contacts except for the selected substrate. The selected subset is exposed to allow testing of the electrical characteristics at the selected subset.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 is a top view of a test fixture constructed in accordance with embodiments of the present invention.

FIG. 4 is a side view of the test fixture of FIG. 3.

FIG. 5 is a top view of the test fixture of FIG. 3 with a chip scale package under test inserted within the test fixture according to the method of the present invention.

FIG. 6 is a cross-section of the test fixture of FIG. 5 with the inserted chip scale package under test, taken along line VI—VI.

DETAILED DESCRIPTION OF THE INVENTION

The present invention addresses and solves problems related to the isolation of one or more solder balls in a chip scale package for electrical characteristic testing. This is achieved, in part, by providing a test fixture that has a conductive plate that is configured to contact all of the electrical contacts (e.g., solder balls) on the chip scale package, except for the selected subset of balls that are to be tested. To provide access to the solder balls for testing, one or more holes are provided within the conductive plate and centered over one or more solder balls. These holes allow access for a test probe to contact the solder ball of interest to test the electrical characteristics at the solder ball, without risk that the other solder balls will be contacted by the probe.

Figure 1:
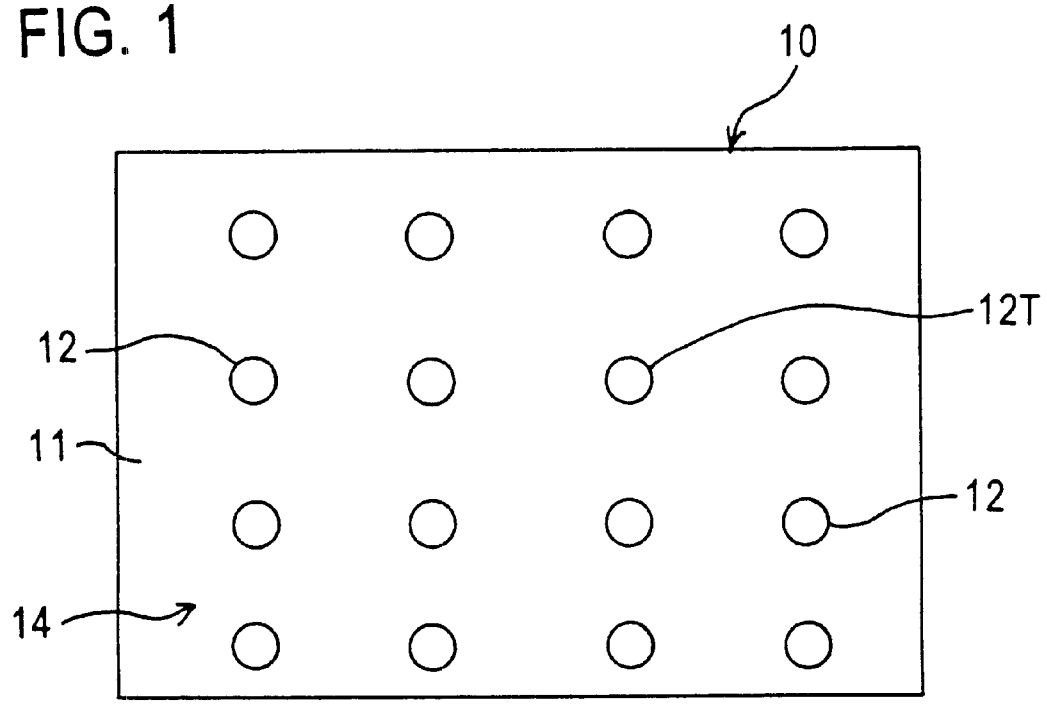
FIG. 1 is an enlarged, schematic top view of an exemplary chip scale package.

An exemplary embodiment of the chip scale package 10 is depicted in top view in FIG. 1. The chip scale package 10 includes a substrate 11, containing the integrated circuitry and/or interconnections. The circuitry is connected to a plurality of electrical contacts 12 formed on one side of the chip scale package 10. In preferred embodiments of the invention, the electrical contacts are formed by substrate balls 12 and are arranged in array 14. Thus, the solder balls form a ball grid array 14. Although depicted for illustration purposes in FIG. 1 as being relatively spread apart, in practice, the substrate balls 12 are very tightly packed on a chip scale package 10 in the ball grid array 14. Thus, it is difficult to isolate one of the solder balls 12 for electrical characteristic testing.

Figure 2:
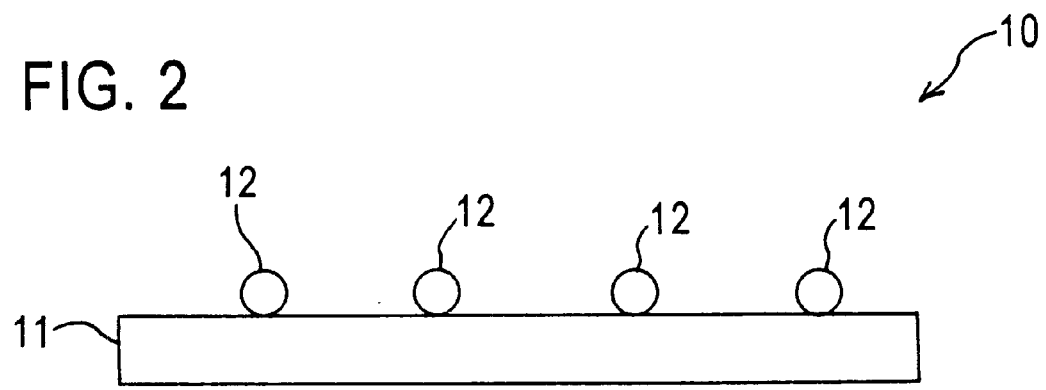
FIG. 2 is a side view of the chip scale package of FIG. 1.

A side view of the chip scale package 10 is provided in FIG. 2. As can be seen from this figure, the electrical contacts or balls extend from only one side of the chip scale package 10. One or more of these solder balls 12 will be a solder ball at which testing is desired. This solder ball to be tested is designated in FIGS. 1 and 2 as 12T. With the remaining balls it is often desirable to ground the remaining balls 12 on the chip scale package 10, at the same time isolating the ball 12T under test.

FIG. 3 is a top view of a test fixture constructed in accordance with embodiments of the present invention. This test fixture is elegant in construction and relatively inexpensive to create. At the same time, however, it provides a thorough grounding of all of the electrical contacts of the chip scale package 10, allowing an isolated subset of the electrical contacts to be tested for electrical characterization.

The test fixture 20 of FIG. 3 includes a base 22 made of either conductive or non-conductive material. For example, the base 22 may be made of a metal or may be made of a ceramic or carbon-fiber composite, or any other suitable material. The base 22 is generally planar in shape with a smooth surface so as not to damage a chip scale package placed on the surface of the base 22.

A conductive isolation plate 24, which serves as a grounding plate, is placed over the base 22. Generally, the isolation plate 24 is smaller in area than the base 22 and is substantially planar. The isolation plate 24 is a conductive plate, and is therefore made of a highly conductive material, such as a conductive metal. The isolation plate 24 is coupled to ground.

The isolation plate 24 is held against the base 22 by a pair of clamps 26 in the illustrated embodiment of FIG. 3. Other holding devices, such as elastomeric hold-down devices, replace the clamps 26 in other embodiments of the invention. The clamping, pressure applied against the isolation plate 24 is adjusted by an adjustment device 29, such as a screw. The adjustment device 29, e.g., a screw, is attached to the base 22.

The isolation plate 24 has a test hole 28 provided at a desired location on the surface of the isolation plate 24. Test hole 28 extends through the isolation plate 24 and is dimensioned so that it is slightly larger than the electrical contact or solder ball 12 of a chip scale package 10. The embodiment of FIG. 3 depicts a single test hole 28, but a plurality of test holes may be provided in isolation plate 24. This would provide access to a plurality of selected balls 12T for testing the electrical characteristics of the chip scale package 10 at these balls 12T. In the embodiment of FIG. 3, however, only a single test hole 28 is depicted.

FIG. 4 is a side view of the test fixture 20 of FIG. 3. The chip scale package 10 is inserted between the isolation plate 24 and the base 22. The clamps 26 may be removed and the isolation plate 24 completely removed from the test fixture 20 prior to the positioning of the chip scale package 10 to be tested. The isolation plate 24 is then placed carefully onto the chip scale package 10 and the clamps 26 tightened through the adjustment device 29.

FIG. 5 depicts the test fixture 20 of FIG. 3, but with a chip scale package 10 inserted in the test fixture 20. The chip scale package 10 is properly positioned on the base 22 and the isolation plate 24 is properly positioned on a chip scale package 10 such that the desired solder balls 12T to be tested fall completely within the test hole 28. If more than one solder ball is to be tested, additional test holes 28 are provided in the isolation plate 24. The clamping pressure applied by the adjustment devices 29, as depicted in FIG. 6, is enough to ensure proper contact of the isolation plate 24 against each of the solder balls 12, but not enough to damage the solder balls 12. With proper contact of the solder balls 12 that are not under test to the isolation plate 24, and the grounding of this isolation plate 24, the solder balls 12 that are not under test are all properly grounded.

The subset of electrical contacts or solder balls 12T that are under test are exposed through the test hole or holes 28 in the isolation plate 24. The dimensioning of the test hole 28 in the isolation plate 24 is slightly larger than the solder ball under test 12. This ensures that the solder ball under test 12T does not contact the conductive isolation plate 24. The test hole 28 needs to be large enough, however, to allow a test probe (not shown) to access the solder ball under test 12T without contacting the isolation plate 24. When the test probe is able to establish contact with the ball under test 12T, the electrical characteristics, such as inductance, capacitance, and resistance at the ball under test 12T, which has been effectively isolated from the other balls 12 on the chip scale package 10, may be ascertained.

The provision of a test fixture that has an isolation plate that grounds all the solder balls of a chip scale package, except for a selected subset of balls, provides an elegant and cost effective solution for isolating a subset of the solder balls of a chip scale package for electrical characterization testing.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A test fixture for holding, for electrical characteristic testing, an integrated circuit chip having a plurality of electrical contacts, the test fixture comprising:

a base;

an isolation plate that is a grounded metal plate; and a holding device configured to hold the isolation plate against the base with an integrated circuit under test between the base and the isolation plate;

wherein the isolation plate is configured to directly contact and ground all of the plurality of electrical contacts of the integrated circuit under test except for a selected subset of the electrical contacts;

wherein the electrical contacts are balls.

2. The test fixture of claim 1, wherein the isolation plate and the base are planar.

3. The test fixture of claim 1, wherein the isolation plate includes at least one hole through the isolation plate that exposes the selected subset of the electrical contacts.

4. The test fixture of claim 3, wherein each hole in the isolation plate exposes only a single one of the electrical contacts.

5. The test fixture of claim 4, wherein each hole is dimensioned to be slightly larger than each exposed electrical contact.

6. The test fixture of claim 5, wherein the selected subset of the electrical contacts consists of a single electrical contact.

7. The test fixture of claim 1, wherein the holding device includes a clamp attached to the base at one end of the clamp, with a free end contacting the isolation plate.

8. The test fixture of claim 7, further comprising an adjustment mechanism for adjusting the clamping force of the clamp against the isolation plate to thereby adjust the pressure exerted by the isolation plate against an integrated circuit under test between the isolation plate and the base.

9. The test fixture of claim 8, wherein the adjustment mechanism is a screw.

10. A method of isolating an electrical contact of a chip scale package for testing the electrical characteristics at the electrical contact, comprising the steps of:

positioning a chip scale package to expose all of the electrical contacts of the chip scale package;

placing a conductive plate on the chip scale package such that the conductive plate directly contacts all of the electrical contacts except for a selected subset of the electrical contacts;

grounding the conductive plate to thereby ground all of the electrical contacts except for the selected subset; and exposing the selected subset to allow testing of the electrical characteristics at the selected subset;

wherein the electrical contacts are balls arranged in a ball grid array.

11. The method of claim 10, wherein the conductive plate includes at least one hole larger than one of the electrical contacts, the steps of placing and exposing including positioning the conductive plate over the chip scale package such that each hole in the conductive plate exposes one of the electrical contacts so that the electrical contact does not contact the conductive plate.

12. The method of claim 11, further comprising clamping the conductive plate on the chip scale package with an adjustable clamping force to pressure the conductive plate against the electrical contacts.

13. The method of claim 12, wherein the adjustable clamping force is provided by a screw mechanism.

14. The method of claim 12, wherein the step of positioning the chip scale package includes placing the chip scale package on a planar base with a first side of the chip scale package contacting the base and a second side of the chip scale package, which contains the electrical contacts, facing away from the base.

15. The method of claim 14, wherein the steps of clamping the conductive plate on the chip scale package includes clamping the conductive plate to the base with the chip scale package therebetween.

* * * * *